(12) United States Patent
Engblom et al.

(10) Patent No.: US 7,800,915 B2
(45) Date of Patent: Sep. 21, 2010

(54) PRINTED BOARD ASSEMBLY

(75) Inventors: Lars Engblom, Stockholm (SE); Mats Johansson, Alvsjo (SE); Peter Scott, Victoria (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 237 days.

(21) Appl. No.: 11/812,508

(22) Filed: Jun. 19, 2007

(65) Prior Publication Data

US 2008/0257594 A1  Oct. 23, 2008

Related U.S. Application Data

(63) Continuation of application No. PCT/SE2007/050259, filed on Apr. 20, 2007.

(51) Int. Cl.
*H01R 12/16* (2006.01)
(52) U.S. Cl. .................. 361/788; 361/798; 361/799; 361/800
(58) Field of Classification Search ................. 361/788, 361/796–800; 710/300–305
See application file for complete search history.

(56) References Cited

U.S. PATENT DOCUMENTS

| | | | | |
|---|---|---|---|---|
| 6,812,803 B2 * | 11/2004 | Goergen | ........................ | 333/1 |
| 7,172,432 B2 | 2/2007 | Campini et al. | | |
| 2004/0059957 A1 | 3/2004 | Menasce et al. | | |
| 2007/0039171 A1 | 2/2007 | Goergen | | |

FOREIGN PATENT DOCUMENTS

WO  WO 0055742  9/2000

OTHER PUBLICATIONS

International Search Report and Written Opinion of the International Searching Authority mailed Feb. 4, 2008 in corresponding Application PCT/SE2007/050259.
Link/website page for *PICMG Open Modular Computing Specialist*: http://www.picmg.org/index.htm.
Link/website page for *PICMG Specifications—Specification Order Forms*: http://www.picmg.org/v2internal/specorderformsec.htm.
PICMG® MTCA.0 R1.0, Micro Telecommunications Computing Architecture Short Form Specification, Sep. 26, 2006, pp. 1-34.
PICMG® MicroTCA.0 Draft Specification Release Candidate 1.0RC2, Micro Telecommunications Computing Architecture Base Specification, Jun. 2, 2006, pp. 1-538.
Tundra Tsi568A Serial RapidIO Switch, 2005, pp. 1-2.

* cited by examiner

*Primary Examiner*—Tuan T Dinh
(74) *Attorney, Agent, or Firm*—Nixon & Vanderhye P.C.

(57) ABSTRACT

The present invention relates to a method and a printed board assembly for use in a MicroTCA system, wherein backplane pin connectors of the printed board assembly are arranged to be received in receiving connectors of a backplane interconnect, characterized in that it comprises at least one switch unit which is arranged with physical output/input ports that have physical port numbers that can be overridden by logical port numbers, an optimal routing of a number of sets of conductive threads in the printed board assembly arranged so that none of the conductive threads cross over each other while connecting physical output/input ports of the switch units with the backplane pin connectors, and printed circuit board layers arranged to shield signals travelling in the conductive threads in conductive layers of the printed circuit board layers from any significant crosstalk.

13 Claims, 10 Drawing Sheets

Fig. 6
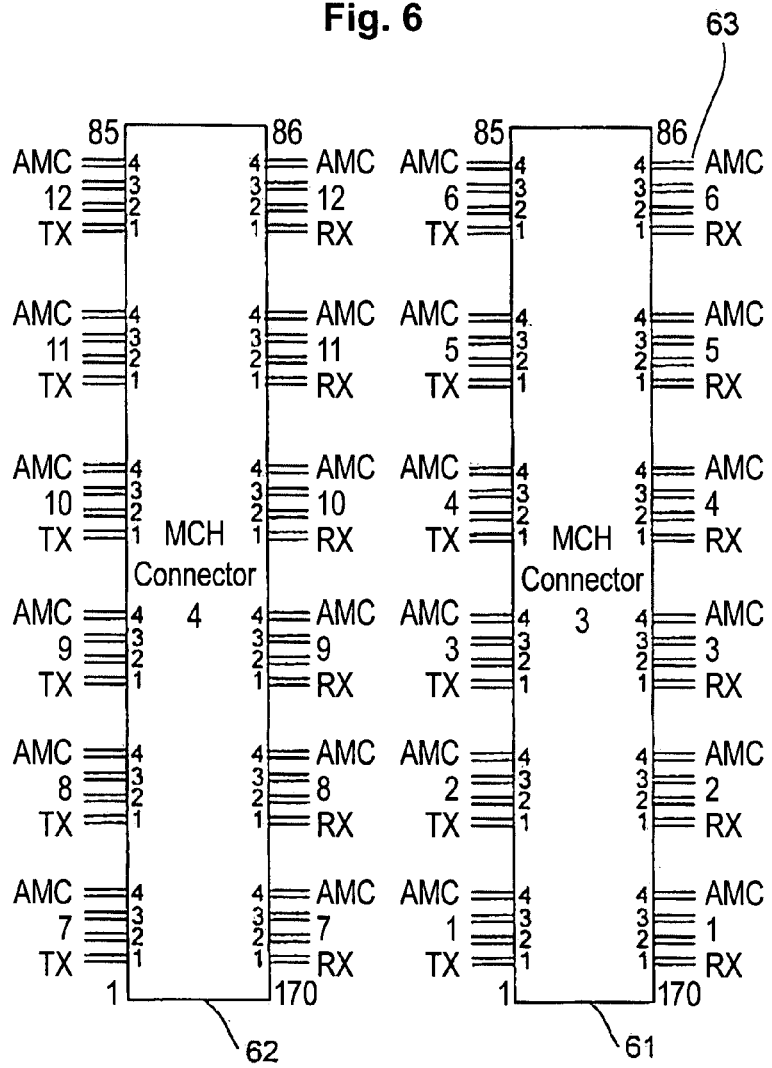
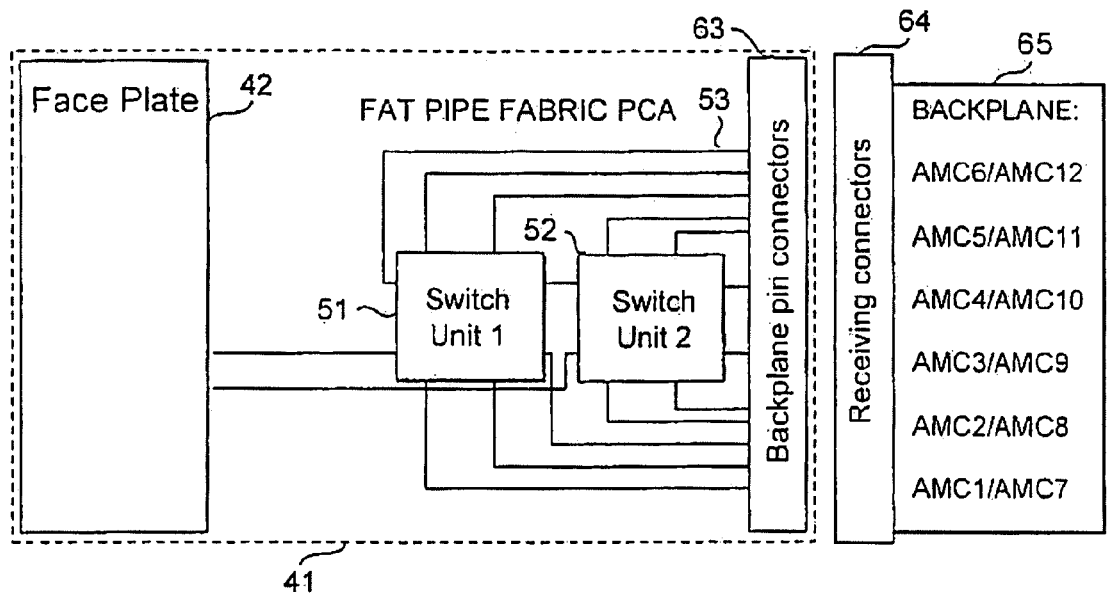

Fig. 8
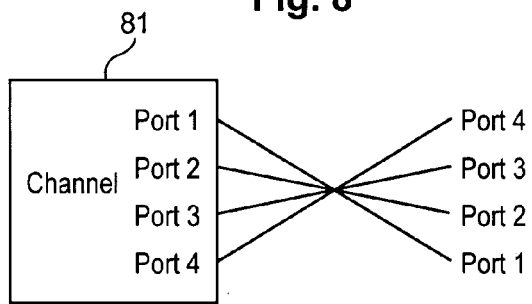
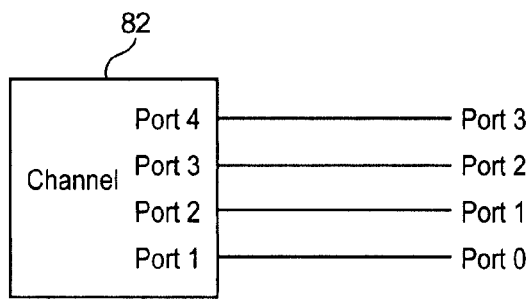
Fig. 9
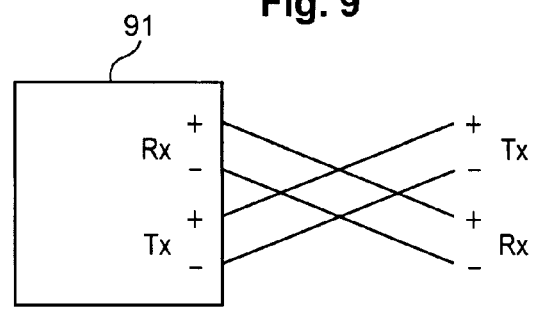
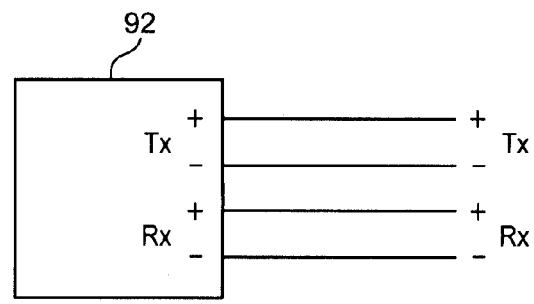

Fig. 10

| Subclass Name | Type | Thickness (μm) | Shield |
|---|---|---|---|
| | SURFACE | | |
| Top | CONDUCTOR | 40 | |
| | DIELECTRIC | 100 | |
| L2-GND | | 18 | X |
| | DIELECTRIC | 65 | |
| L3-1_2V | | 18 | X |
| | DIELECTRIC | 100 | |
| L4-X | CONDUCTOR | 18 | |
| | DIELECTRIC | 65 | |
| L5-Y | CONDUCTOR | 18 | |
| | DIELECTRIC | 100 | |
| L6-GND | | 18 | X |
| | DIELECTRIC | 65 | |
| L7-GND | | 18 | X |
| | DIELECTRIC | 100 | |
| L8-X | CONDUCTOR | 18 | |
| | DIELECTRIC | 65 | |
| L9-Y | CONDUCTOR | 18 | |
| | DIELECTRIC | 100 | |
| L10-P1_5V-GND | | 18 | X |
| | DIELECTRIC | 65 | |
| L11-GND | | 18 | X |
| | DIELECTRIC | 100 | |
| L12-X | CONDUCTOR | 18 | |
| | DIELECTRIC | 65 | |
| L13-Y | CONDUCTOR | 18 | |
| | DIELECTRIC | 100 | |
| L14-GND | | 18 | X |
| | DIELECTRIC | 65 | |
| L15-GND-3_3V | | 18 | X |
| | DIELECTRIC | 100 | |
| BOTTOM | CONDUCTOR | 40 | |
| | SURFACE | | |

Total: 1587

Fig. 11

| Subclass Name | Type | Thickness (μm) | Shield |
|---|---|---|---|
| | SURFACE | | |
| Top | CONDUCTOR | 40 | |
| | DIELECTRIC | 100 | |
| L2-GND | | 18 | X |
| | DIELECTRIC | 65 | |
| L3-1_2V | | 18 | X |
| | DIELECTRIC | 100 | |
| L4-X | CONDUCTOR | 18 | |
| | DIELECTRIC | 100 | |
| L5-EXTRA | | 18 | X |
| | DIELECTRIC | 100 | |
| L6-Y | CONDUCTOR | 18 | |
| | DIELECTRIC | 100 | |
| L7-GND | | 18 | X |
| | DIELECTRIC | 100 | |
| L8-X | CONDUCTOR | 18 | |
| | DIELECTRIC | 100 | |
| L9-EXTRA | | 18 | X |
| | DIELECTRIC | 100 | |
| L10-Y | CONDUCTOR | 18 | |
| | DIELECTRIC | 100 | |
| L11-P1_5V-GND | | 18 | X |
| | DIELECTRIC | 65 | |
| L12-GND | | 18 | X |
| | DIELECTRIC | 100 | |
| L13-X | CONDUCTOR | 18 | |
| | DIELECTRIC | 100 | |
| L14-EXTRA | | 18 | X |
| | DIELECTRIC | 100 | |
| L15-Y | CONDUCTOR | 18 | |
| | DIELECTRIC | 100 | |
| L16-GND | | 18 | X |
| | DIELECTRIC | 65 | |
| L17-GND-3_3V | | 18 | X |
| | DIELECTRIC | 100 | |
| BOTTOM | CONDUCTOR | 40 | |
| | SURFACE | | |

Total: 1963

Fig. 12

| Subclass Name | Type | Thickness (μm) | Shield |
|---|---|---|---|
|  | SURFACE |  |  |
| Top | CONDUCTOR | 40 |  |
|  | DIELECTRIC | 100 |  |
| L2-GND |  | 18 | X |
|  | DIELECTRIC | 100 |  |
| L3-RX1 | CONDUCTOR | 18 |  |
|  | DIELECTRIC | 100 |  |
| L4-GND |  | 18 | X |
|  | DIELECTRIC | 100 |  |
| L5-TX2 | CONDUCTOR | 18 |  |
|  | DIELECTRIC | 100 |  |
| L6-P3_3V |  | 18 | X |
|  | DIELECTRIC | 100 |  |
| L7-GND |  | 18 | X |
|  | DIELECTRIC | 100 |  |
| L8-P1_2V |  | 18 | X |
|  | DIELECTRIC | 100 |  |
| L9-TX1 | CONDUCTOR | 18 |  |
|  | DIELECTRIC | 100 |  |
| L10-GND |  | 18 | X |
|  | DIELECTRIC | 100 |  |
| L11-RX2 | CONDUCTOR | 18 |  |
|  | DIELECTRIC | 100 |  |
| L12-GND |  | 18 | X |
|  | DIELECTRIC | 100 |  |
| L13-P1_2V_SP |  | 18 | X |
|  | DIELECTRIC | 100 |  |
| BOTTOM | CONDUCTOR | 40 |  |
|  | SURFACE |  |  |

Total: 1596

PRINTED BOARD ASSEMBLY

This is a Continuation application of International Application No. PCT/SE2007/050259filed 20 Apr. 2007, the entire contents of which are hereby incorporated herein by reference.

TECHNICAL FIELD

The present invention relates to printed board assemblies in general and in particular to a printed board assembly and a method for enabling optimal routing in a MicroTCA system.

BACKGROUND

A MicroTCA (Micro Telecommunications Computing Architecture) is a modular standard that specifies a number of requirements for a system that intends to connect PICMG® Advanced Mezzanine Cards (AdvancedMCs) directly to a backplane interconnect.

PICMG® is a consortium of over 450 companies who collaboratively develop open specifications for high performance telecommunications and industrial computing applications. The members of the consortium have a long history of developing leading edge products for these industries. More information about PICMG® may be found, for example, on the internet: http://www.picmg.org/index.htm (2007 Apr. 16).

In the PICMG® Micro Telecommunications Computing Architecture (MicroTCA™) specification, the general mechanical, electrical, thermal, and management properties of a MicroTCA system that are necessary for supporting AdvancedMC.0-compliant Modules are defined. As this standard specification requires, amongst other things, that the printed board assemblies fulfil certain maximum size measurements, it has been proven difficult to realize some of the components accordingly and still maintain the same functionalities.

An introduction to MicroTCA may also be found in the Micro Telecommunications Computing Architecture Short Form Specification made available for free, for example, on the internet: http://www.picmg.org/pdf/MicroTCA_Short_Form_Sept__2006.pdf (2007 Apr. 16).

The complete Micro Telecommunications Computing Architecture Base Specification, PICMG MTCA.0 R1.0 and information on how to order it can be found, for example, on the internet: http://www.picmg.org/v2internal/specorderformsec.htm (2007 Apr. 16).

The Advanced Mezzanine Card Base Specification, AMC.0 R2.0 and information on how to order it can be found, for example, on the internet: http://www.picmg.org/v2internal/specorderformsec.htm (2007 Apr. 16)

SUMMARY

It is an object to enable a compact design of printed board assemblies, in particular for a MicroTCA system, and provide a printed board assembly and a method that enables optimal routing in MicroTCA.

The object is achieved by a printed board assembly as defined in claim 1.

Further advantageous, example, and non-limiting embodiments are set forth in the dependent claims.

BRIEF DESCRIPTION OF THE DRAWINGS

In the following drawings, same reference numerals correspond to the same element, in which:

FIG. 6 shows an optimal routing for a printed board assembly (PBA) according to another example embodiment.
FIG. 8 shows an optimal routing for a printed board assembly (PBA) according to a further example embodiment.
FIG. 9 shows an optimal routing for a printed board assembly (PBA) according to a further example embodiment.
FIG. 10 shows a layer stack up of a printed circuit board (PCB) form.
FIG. 11 shows another layer stack up of a PCB form.
FIG. 12 shows a layer stack up of a PCB form according to an example embodiment.

DESCRIPTION

It is to be understood that the innovative features, although described below in reference to exemplary embodiments of a MicroTCA system, can be applied to a wide range of printed assembly boards for enabling optimal routing. The technological features described are particularly advantageous where a compact design is wanted and there are restraints on the format.

A minimum MicroTCA system may be defined as a collection of interconnected components consisting of at least one AdvancedMC, at least one MicroTCA Carrier Hub (MCH), a backplane interconnect and also power, cooling, and mechanical resources needed to support them.

Figure 1:
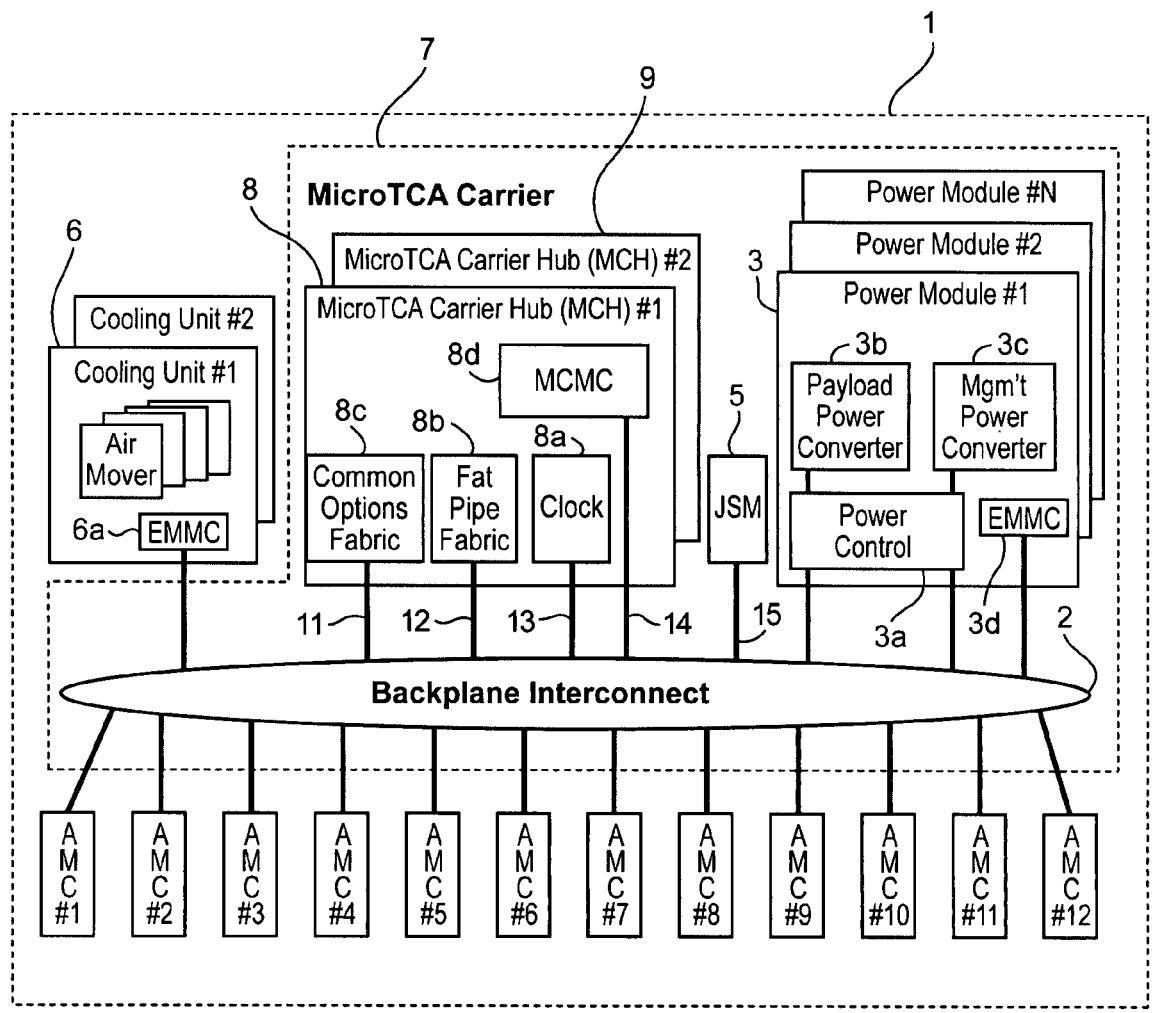
FIG. 1 illustrates an example of a MicroTCA system.

In FIG. 1, an illustrative example of such a MicroTCA system 1 is shown. In this example, the MicroTCA system 1 comprises twelve AdvancedMCs, AMC #1-AMC #12, wherein each of the twelve AdvancedMCs, AMC #1-AMC #12, is connected to a backplane interconnect 2, described in the following. AdvancedMCs are the primary component of MicroTCA. They provide the functional elements needed to implement useful system functions. Examples of AdvancedMCs that may be installed into a MicroTCA system include CPUs, Digital Signal Processing devices, packet processors, storage, and various sorts of I/O AdvancedMCs (including metallic and optical line units, RF devices, and interfaces to other boxes) or the like.

A power module #1 3 is provided for controlling the power supply to the MicroTCA system 1. A suitable number N of power modules #1-#N may be provided in order to enable, for example, load sharing and redundancy. The power module #1 3 may include a power control 3a, which may be connected to a payload converter 3b and a management power converter 3c. The power module #1 3 may also include an EMMC 3d, Enhanced Module Management Controller. The power control 3a and the EMMC 3d in the power module #1 3 may both be direct connections to the backplane interconnect 2.

A JTAG Switch Module (JSM) 5 is provided for controlling the distribution of JTAG signalling to the AdvancedMCs and MCHs within a MicroTCA Carrier.

A cooling unit #1 6 is provided for controlling the thermal conditions of the components of the MicroTCA system 1. A suitable number of cooling units, for example, in this case an additional cooling unit #2, may also be provided for redundancy in the MicroTCA system 1. The cooling unit #1 may include an EMMC 6a, which may be directly connected to the backplane interconnect 2.

The backplane interconnect 2 may be arranged with a receiving connectors such as backplane plug connectors, card edge fingers or the like, which are arranged to receive the backplane connector pins of the components of the MicroTCA system 1. This allows the components of the MicroTCA system 1 to communicate with each other over the backplane interconnect 2.

Figure 3:
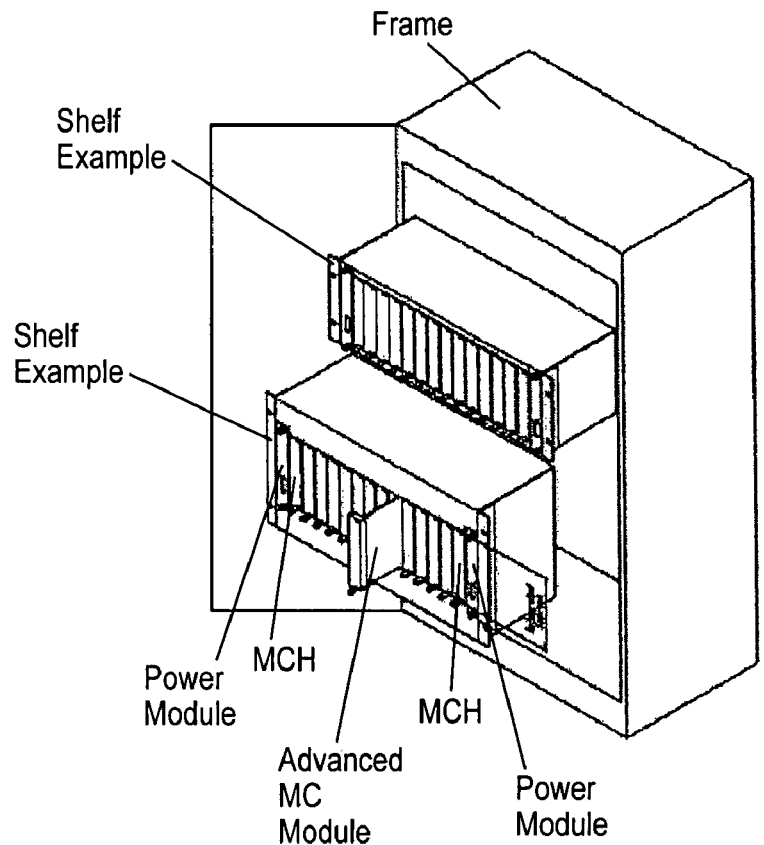
FIG. 3 shows an arrangement for supporting the components of a MicroTCA system.

As shown in FIG. 3, mechanical elements are needed to support the components of the MicroTCA system 1 and may comprise a sub rack or shelf, wherein the backplane interconnect 2 is preferably arranged to receive the components of the MicroTCA system 1 as they are slid into and mounted in the sub rack or shelf. The sub rack or shelf can then be slid into a convenient frame arranged to support the sub rack or shelf. The shelf may be said to comprise the electronic assembly of the sub rack, backplane interconnect 2, Modules, cooling devices 6, power subsystems 3 etc. The shelf is historically also known as a chassis. The sub rack may be said to comprise the mechanical assembly that provides the interface to Modules, including the AdvancedMCs, and consists of the Card Guides, ESD discharge, alignment/keying, Handle interface, Face plate mounting hardware, EMC Gasketing and Backplane interface.

The concept of a MicroTCA Carrier 7 formed the basis for the MicroTCA specification. The MicroTCA Carrier 7 emulates the requirements of the Carrier Board defined in AMC.0, which specifies how to properly host AdvancedMC modules. The carrier functional requirements of the AMC.0 include power delivery, interconnects and Intelligent Peripheral Management Interface (IPMI) etc. The MicroTCA Carrier 7 refers to the carrier functions needed to provide an infrastructure that may support nominally twelve AdvancedMCs. The carrier functions are represented in the MicroTCA system 1 by the elements inside the dotted line in FIG. 1.

In FIG. 1, a MCH #1 8 is connected to the backplane interconnect 2. The MCH #1 8 combines into a single module, the control and management infrastructure and the backplane interconnect 2 fabric resources needed to support, as in this example, the twelve AdvancedMCs. Since the MCH #1 8 represent a single point of failure in the MicroTCA system 1 (where any fault in the MCH #1 8 could bring down the entire MicroTCA system 1), it is also possible to include a second MCH #2 9 in order to make the system more redundant and robust, and thereby also more suitable for High Availability (HA) applications. MCHs 8, 9 are the infrastructure components that are shared by all AdvancedMCs.

In this example, the MCH #1 8 includes a clock 8a, a Fat Pipe Fabric 8b, a Common Options Fabric 8c and an MCMC 8d, Management Control for Management Carrier. The components of the MCH #1 8 are implemented on printed board assemblies (PBAs). The printed board assemblies (PBAs) of the components of the MCH #1 8 comprise backplane connector pins for communicating through the backplane interconnect 2. The backplane connector pins are arranged to be received in the receiving connectors of the backplane interconnect 2, for example, backplane plug connectors. The backplane connector pins of the printed board assemblies (PBAs) and the receiving connectors of the backplane interconnect 2 which receive the backplane connector pins, respectively, are represented in FIG. 1 as comprised in the backplane connections 11-14. The backplane interconnect 2 is preferably mounted at the back of a sub rack or shelf system as shown in FIG. 3.

Figure 2:
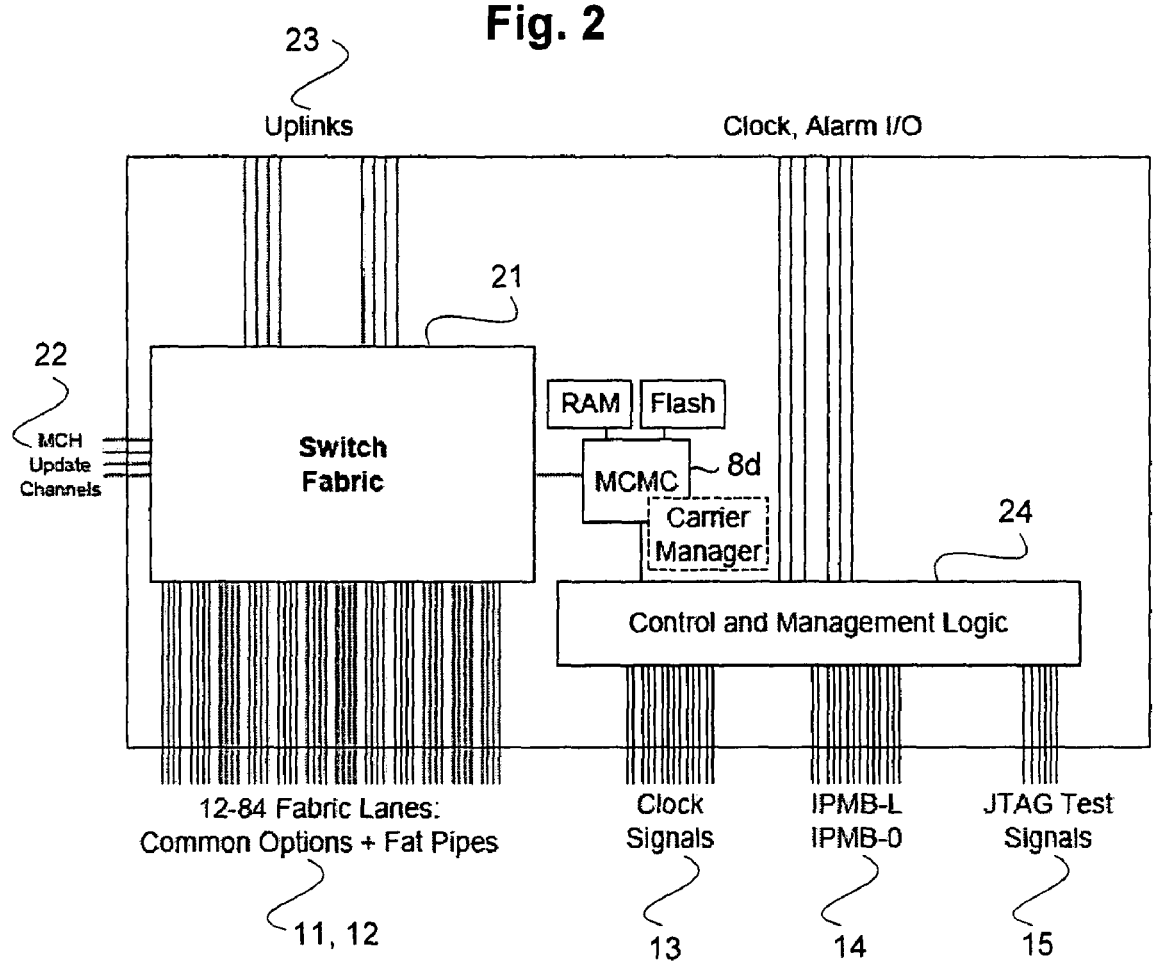
FIG. 2 shows a block diagram of an MCH.

A block diagram of an MCH is shown in FIG. 2. In FIG. 2, a Switch Fabric 21 schematically represents the Fat Pipe Fabric 8b and the Common Options Fabric 8c shown in FIG. 1. The Switch Fabric 21 demonstrates how outputs/inputs of the Fat Pipe Fabric 8b and the Common Options Fabric 8c shown in FIG. 1 are drawn in Fabric Lanes (here also referred to as Fabric Channels) to the backplane interconnect 2 via the backplane connections 11 and 12, also shown in FIG. 1.

The Switch Fabric 21 in the block diagram of FIG. 2 may also comprise MCH update channels 22, which can be used for copying update information from the MCH to, for example, a second MCH 9 as shown in FIG. 1. The Switch Fabric 21 also demonstrates how the Fat Pipe Fabric 8b and the Common Options Fabric 8c shown in FIG. 1 may be arranged with Uplinks 23 to other external unit, for example, other MicroTCA systems. The block diagram of FIG. 2 also demonstrates how a Control and Management Logic 24, which is connected to the MCMC 8d (also shown in FIG. 1), may output Clock Signals and MCMC-information (IPMB-L/IPMB-O) to the backplane interconnect 2 via the backplane connections 13 and 14, also shown in FIG. 1.

Figure 4:
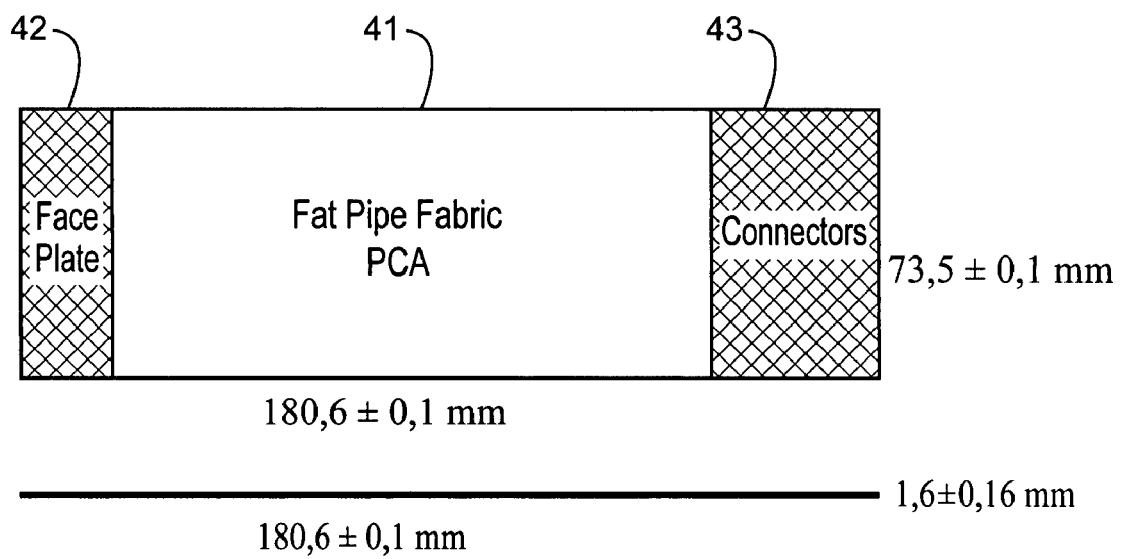
FIG. 4 illustrates a printed board assembly (PBA) of a Fat Pipe Fabric.

However, the requirements of the MicroTCA specification on a MicroTCA system 1 as described above especially regarding the size and thickness of a printed board assembly, cause a number of problems when trying to realize and construct, for example, a Printed Board Assembly (PBA) 41, as shown in FIG. 4, to form a Fat Pipe Fabric 8b of a MicroTCA Carrier Hub (MCH) 8 in a MicroTCA system 1. In FIG. 4, which shows the Fat Pipe Fabric PBA 41, the MicroTCA specification scale requirements are also included.

Figure 5:
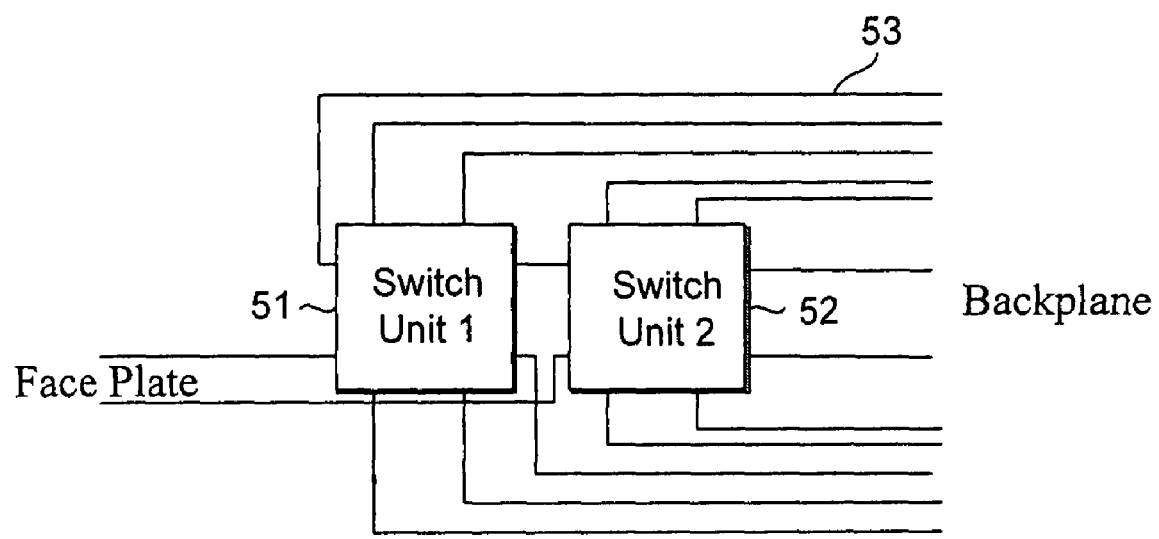
FIG. 5 shows an optimal routing for a printed board assembly (PBA) according to an example embodiment.

In a preferred example embodiment according to FIGS. 5-6, which illustrates example optimal routing made possible by the technology described herein, the Fat Pipe Fabric PBA 41 comprises two switch units 51 and 52, each having 8 physical output/input ports. These physical output/input ports are numbered from 1-8. Each of these physical output/input ports is connected to a Fabric Channel 53. Each Fabric Channel 53 comprises 4 individual channel ports. These individual channel ports are numbered from 1-4. Each of these individual channel ports comprises 4 conductive threads, two for the transmitting signal and two for the receiving signal. These two differential signal pairs may also be referred to as a lane. As an example, the conductive threads of two of the Fabric Channels 53, one for each switch unit 51 and 52, may run to a Face Plate 42 of the Fat Pipe Fabric PBA 41 and may comprise the Uplinks 22 described in reference to FIG. 2. The Face Plate 42 is the front most element of a Module and is attached perpendicular to the PBA 41. The Face Plate 42 may serve to mount connectors, indicators, controls and also seals the front of the sub rack or shelf for airflow and EMC. As a further example, the conductive threads of one Fabric Channel 53 may also run between the two switch units 51 and 52. This allows communication between the two switch units 51 and 52. Each of the rest of the conductive threads from the remaining channels of the two switching units 51 and 52 has a corresponding backplane connector pin 63 among the backplane connectors 43. These remaining conductive threads are therefore routed in the Fat Pipe Fabric PBA 41 from the switch units 51 and 52 to its corresponding backplane connector pin 63. The Fat Pipes, that is, said remaining conductive threads, are distributed to their corresponding backplane connector pin 63 over two parallel backplane MCH connector planes, shown in FIG. 6, the right MCH connector 3 61 for AMC 1-6, and the left MCH connector 4 62 for AMC 7-12. In total, the Fat Pipes to and from the 12 AMCs consists of 12×4×2×2 =192 signal pins towards the backplane interconnect 65 (12 channels from the two switch units 51 and 52, each containing 4 ports each with 2 transmitting threads and 2 receiving threads).

In the MicroTCA specification it is specified which conductive thread must be connected to which backplane connector pin, i.e. the corresponding backplane connector pin 63. Consequently, the MicroTCA specification also specifies where the individual channel ports must be connected. Thus, also implicitly specifying where the channels 53 must be connected and consequently also where each physical output/input port of the two switching units 51 and 52 must be connected. This fixed backplane connector pin allocation as specified in the MicroTCA specification, results in that it conventionally has been impossible to route the conductive threads from the two switching units 51 and 52 to their specified backplane connector pins 63, without either exceeding the PBA maximum thickness specified by the MicroTCA specification or experiencing severe interference or crosstalk between the conductive threads, which may result in large signal bit-errors. The high transferring speeds of the signals which causes the latter makes it important to shield the threads from each other and is primarily performed in the Printed Circuit Board (PCB) layering process.

So, when trying to realize and construct a Printed Board Assembly 41 (PBA) to form the Fat Pipe Fabric 8b of a MicroTCA Carrier Hub (MCH) 8 in a MicroTCA system 1, as described in reference to FIGS. 1-4 above, in accordance with the requirements of the MicroTCA specification, the problems which arise are in more detail:

The specified total width (73.5±0.1 mm) available for the backplane connector pins 63, according to the scale requirements of the MicroTCA specification and in order for all backplane connector pins 43 to correspond to a receiving connector 64 in the backplane interconnect 65, requires that the distance between each backplane connector pin 63 must be made much smaller. Additionally, the backplane interconnect 65 also requires smaller backplane connectors pins 63. It follows that the conductive threads in the Fat Pipe Fabric PBA 41 must be distributed to the backplane connector pins 63 on a narrower and smaller area.

The maximum PBA thickness is limited by the MicroTCA specification to 1,6 mm±0,16 mm, which puts constraints on how many layers that can be used in the PCB form. This maximum PBA thickness also includes production tolerances in the manufacturing.

Because of the signals in the conductive threads being routed very close together on a much smaller space and in the same direction, that is, to/from the backplane connector pins 63, crosstalk occurs. Additionally, crosstalk also occurs since the maximum PBA thickness requirement of the specification does not allow the number and/or total thickness of the layers provided by conventional layering, which gives sufficient shielding of signals in-between the different layers comprising the conductive threads. In short, conventional layering exceeds the maximum PBA thickness.

The fixed backplane connector pin allocation in the MicroTCA specification causes problems with signal twist amongst the channels, which occur in signals travelling in channels that crosses each other, as ports are combined (e.g. 4×3, 125 GBit/s) to enable higher bandwidth.

The fixed backplane connector pin allocation in the MicroTCA specification also causes problems, that is, crosstalk, for signals travelling from port to port within a channel as the routes they travel in are routed across each other.

These problems are solved according to the following. As mentioned, the scale requirements, that is, the Fat Pipe Fabric PBA 41 and backplane form factor, of the MicroTCA specification in designing switch fabrics makes it very difficult, especially in the Fat Pipe Fabric PBA 41 as it contains a large number of conductive threads, to route the outputs/inputs of the switch units 51 and 52 to the backplane connector pins 63 of the MCH connectors 61 and 62. This inevitably results in the crossing of signals. This expresses an urgent need to achieve a simpler and easier routing from the switch units 51 and 52 to the backplane connector pins 63. It may also be mentioned that normally the Fat Pipe Fabric PBA 41 form factor allows the fabric silicon of the switch units 51 and 52, to be centred, thus allowing routing in all directions to and from the fabric silicon of the switch units 51 and 52, and a wider receiving connector 64 to the backplane interconnect 65 that provides a wider distribution of the signals to bigger/wider backplane connector pins 63 of the MCH connectors 61 and 62.

The optimal routing of signals in the Fat Pipe Fabric PBA 41 from the switch units 51 and 52 to the backplane connector pins 63 of the MCH connectors 61 and 62, shown in FIGS. 5-6, is primarily made possible by the present invention by utilizing a feature of user defined settings of logical ports in the switch units 51 and 52 and by a layering technique that only requires 14 layers to provide sufficient shielding of the signals. In the example of FIG. 6, the channel distribution to the AMCs, the port distribution within the channels and thread distribution of the MCH connectors 61 and 62 are illustrated, and also the numbers of the outermost backplane connector pins 63 are depicted.

The optimal routing of signals in the Fat Pipe Fabric PBA 41 from the switch units 51 and 52 to the backplane connector pins 63 of the MCH connectors 61 and 62, shown in FIGS. 5-6, is primarily made possible by utilizing a feature of user defined settings of logical ports in the switch units 51 and 52 and by a layering technique that only requires 14 layers to provide sufficient shielding of the signals. In the example of FIG. 6, the channel distribution to the AMCs, the port distribution within the channels and thread distribution of the MCH connectors 61 and 62 are illustrated, and also the numbers of the outermost backplane connector pins 63 are depicted.

The optimal routing as depicted in FIGS. 5-6 is not possible to implement according to the MicroTCA specification using conventional ways mostly because of the specifications fixed backplane connector pin allocation and the use of switch units with fixed physical port allocation. However, according to a preferred example embodiment, by using that the fabric silicon of the switch units 51 and 52 are provided with the possibility of user defined settings of logical ports, a freedom in the PBA routing is achieved. That is, the switch units 51 and 52 leave it to a user to set in the software user defined logical port numbers that overrides the physical port numbers. Also, by using that the fabric silicon of the switch units 51 and 52 further is provided with the possibility to set the numbering of each of the individual channel ports and also maybe the conductive threads, that is, change the individual port number setting and the conductive threads within the channel, it is left to the user to in the software sort out the right connection between the logical and physical port numbers of the switch units 51 and 52 in order to allow the optimal PBA routing and still follow the MicroTCA specifications fixed backplane connector pin allocation.

An example of the switch units 51 and 52 that comprises fabric that supports these features is the Tundra Tsi568™. Although these particular switch units have 8 physical output/input ports, as described in the preferred embodiments, it is to be understood that the present invention may also include switch units 51 and 52 that comprises more or less than 8 physical output/input ports. Further, although described as including only two switch units 51 and 52, it is to be understood that more or less than two switch units may be included. More details about the particular fabric of the Tundra Tsi568™ may be found, for example, on the internet: http://www.tundra.com/product_detail.aspx?newproduct=true&bid=920&id=1057 (2007 Apr. 16).

Figure 7:
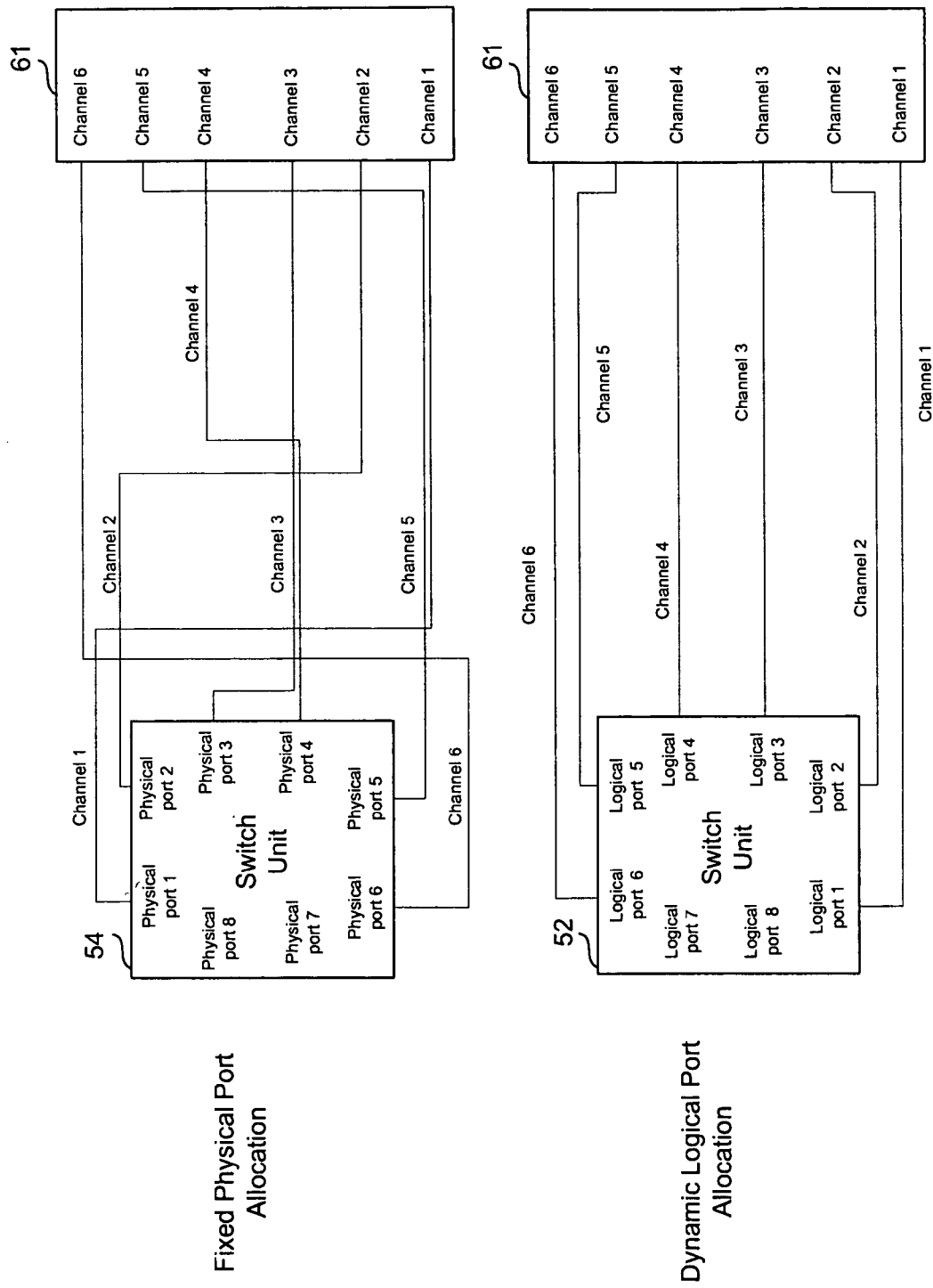
FIG. 7 shows an optimal routing for a printed board assembly (PBA) according to a further example embodiment.

As illustrated in FIG. 7, it should be noted that this particular fabric, when it comes to changing the physical output/input ports 1-8 to logical port numbers, is able to switch to any suitable logical port number order, for example as depicted in FIG. 7, the physical output/input port 1 may be changed to the logical port number 6, the physical output/input port 3 may be changed to the logical port number 4, etc. Further, as illustrated in FIGS. 8, it should also be noted that this particular fabric, when it comes to changing the port number settings within a channel, is only able to switch the order of the ports, for example, switching the port order 1, 2, 3, 4 to the port order 4, 3, 2, 1 or vice versa within a channel. This is enough to comply with the MicroTCA specifications fixed backplane connector pin allocation when performing said optimal routing. Although, it should also be noted that this is not to be construed as limiting for the present invention, but also be considered to include other future fabrics which may allow separate individual port settings.

In the upper portion of FIG. 7, in a switch unit 52 with fixed physical port allocation, the channels from the physical output/input ports 1-8 have to be crossed in order for the right physical output/input port to correspond to the right backplane connector pins 63 according to the MicroTCA specification. This is solved, as indicated by the lower portion of FIG. 7, by, for example, dynamically in the software switching the physical output/input ports 1-8 (which is the same as for the upper portion) to logical port numbers in a suitable way. In the example shown in FIG. 7, the physical output/input ports 1-8 of a switch unit 52 are switched to logical port numbers and the channels does not have to be crossed in order for the right physical output/input port to correspond to the right backplane connector pins 63 according to the MicroTCA specification.

In the upper portion of FIG. 8, the individual channel ports 1-4 of a channel 81 have to be crossed within the channel 81 in order for the right individual channel port to correspond to the right backplane connector pin 63 according to the MicroTCA specification. In a preferred embodiment, this is solved, as indicated by the lower portion of FIG. 8, by, for example, dynamically in the software switching the logical port numbers in a suitable way. In the example shown in FIG. 8 the individual channel ports 1-4 of a channel 82 in the switch unit 51 or 52 are switched from 1, 2, 3, 4 to 4, 3, 2, 1.

In the upper portion of FIG. 9, the conductive threads Tx+, Tx– (for the transmitting signals) and Rx+, Rx– (for the receiving signals) of a port 91, may have to be crossed in order for the right conductive thread to correspond to the right backplane connector pin 63. In a preferred embodiment, this is solved, as indicated by the lower portion of FIG. 9, by, for example, having bi-directional threads and dynamically in the software switching the differential signal pair order in a suitable way. In the example shown in FIG. 9, the differential signal pair order of a port 92 in the switch unit 51 or 52 are switched from Rx+, Rx–, Tx+, Tx– to Tx+, Tx–, Rx+, Rx–.

However, this does not solve all of the problems stated above. Only providing the dynamical switching of the channel and port order, as shown in FIGS. 7-8, is not enough to enable an optimal routing that fulfils the requirements of the MicroTCA specification. The optimal routing according to FIGS. 5-6, will by normal PCB design end up in the 16 layer design shown FIG. 10. This conventional layering will fulfil the requirements of the MicroTCA specification regarding maximum PBA thickness of the Fat Pipe Fabric PBA 41 (1,587 mm<1,6 mm), but crosstalk will still occur between signals travelling in the CONDUCTOR layers L4X and L5Y, L8X and L9Y, and L12X and L13Y. This will cause severe interference and result in significant bit errors in the signals.

In FIG. 10-12, the SURFACE layer is typically air and represents the outermost edge of the PCB form, each CONDUCTOR layer is preferably a signal layer of Copper (Cu), each PLANE layer is preferably a plane of Copper (Cu), which may be ground (GND) or have a balancing voltage applied to it, and each DIELECTRIC layer is preferably made of glass fiber/epoxy laminate or prepreg (a laminate without Copper (Cu)), for example, FR4.

By adding an extra isolating layer, that is, the layers L5-EXTRA, L9-EXTRA and L14-EXTRA in FIG. 11, between the layers L4X and L5Y, between the layers L8X and L9Y, and between the layers L12X and L13Y, respectively, of the 16 layer design in FIG. 9, the crosstalk of the signals travelling in these layers may be avoided. This gives the 18 layer design shown in FIG. 11. Unfortunately, this 18 layer design has a PBA thickness of 1,963 mm which exceeds the maximum PBA thickness of 1,6 mm+0,16 mm according to the MicroTCA specification.

In FIG. 12, and according to a preferred example embodiment, in order to get the correct impedance of 100 Ohm ($\Omega$) on all differential conducts on the signal layers L4X, L5Y, L8X, L9Y, L12X and L13Y, the thickness of the laminate and the prepreg was all changed to 100 µm. In the 16 layer PCB design the thickness of the laminate and the prepreg was sometimes 65 µm and sometimes 100 µm. The new layer stack-up gave only 14 layers, as shown in FIG. 12. The new PCB design, which has two layers less than the conventional 16 layer PCB design, has grounded PLANE layers L4-GND, L7-GND and L10-GND in between the CONDUCTOR layers L3-RX1 and L5-TX2, in between the CONDUCTOR layers L5-TX2 and L9-TX1, and in between the CONDUCTOR layers L9-TX1 and L11-RX2, respectively, thus shielding the signals in the CONDUCTOR layers L3-RX1, L5-TX2, L9-TX1 and L11-RX2 from each other. Thus, all signals travelling in these layers can travel longer distances above or below each other without experiencing any significant crosstalk between them. The new PCB design reaches a PBA thickness of 1,596 mm, which is close to, yet below, the maximum PBA thickness of 1.6 mm±0.16 mm according to the MicroTCA specification. This also leaves good margin for production tolerances in the manufacturing.

It is also important to note that, according to a preferred example embodiment, only when combining the previous embodiments may all of the problems addressed above be solved and the Printed Board Assembly 41 (PBA) forming the Fat Pipe Fabric 8b of a MicroTCA Carrier Hub (MCH) 8 in a MicroTCA system 1 be constructed and realized in accordance with the requirements of the MicroTCA specification. Additionally, without the optimal routing as described in FIGS. 5-6 and thus avoiding channel and port crossings in the channels, that is, using routing based on fixed port allocation in the switch units, routing is not possible in the new PCB design as shown in FIG. 12 which includes fewer layers.

Also, the optimal routing and layering according to the present invention may be extended, by using the same principles as described above, to performing independent routing in a backplane interconnect 65 as well. This would allow an automatic configuration, for example, during booting, to calculate the correct port numbers and load this information, for example, into port translate tables in the fabric. This may be performed by, for example, storing the free routing relations for the Fat Pipe Fabric PBA 41 and/or the backplane interconnect 65 in, for example, a corresponding PROM, Programmable Read-Only Memory or the like.

It should be noted that although, for example, a certain number of signal pins are defined in the MicroTCA specification and the embodiments above are described with reference to the same number of signal pins, the optimal fabric routing and layering technology described may be used to realize and construct future standards (for example, specifying more/less number of signal pins) of the MicroTCA system 1 in FIG. 1.

A MicroTCA system 1 as described in accordance with the example embodiments has a primary purpose of serving as a platform for telecommunications and enterprise computer network equipment. A secondary goal for the MicroTCA system 1 as described in accordance with the example embodiments is to function as a platform for other demanding marketplaces, such as, for example, Customer Premises Equipment (CPE).

The MicroTCA system 1 is designed to address cost sensitive and physically smaller applications with lower capacity, performance, and perhaps less stringent availability requirements. By configuring highly diverse collections of AdvancedMCs in a MicroTCA Shelf, many different application architectures can be easily realized. The common elements defined by the MicroTCA system 1 are capable of interconnecting these AdvancedMCs in many interesting ways—powering and managing them, all at high efficiency and low cost.

The invention claimed is:

1. A printed board assembly for use in a MicroTCA system that complies with a MicroTCA Base Specification, wherein backplane pin connectors of said printed board assembly are arranged to be received in receiving connectors of a backplane interconnect, comprising:
    at least one switch unit which is arranged with physical out-put/input ports that have physical port numbers overridden by logical port numbers,
    an optimal routing of a number of sets of conductive threads in said printed board assembly arranged so that none of said conductive threads cross over each other while connecting physical output/input ports of said switch unit with said backplane pin connectors, and
    printed circuit board layers arranged to shield signals traveling in said conductive threads in conductive layers of said printed circuit board layers from any significant crosstalk,
    wherein the printed circuit board assembly complies with the MicroTCA Base Specification.

2. A printed board assembly according to claim 1, wherein the printed circuit board layers of said printed board assembly have a combined total thickness that is within the MicroTCA standard of 1.6 mm ±0.16 mm.

3. A printed board assembly according to claim 1, wherein the total width of said printed board assembly is within the MicroTCA standard of 73.5 mm ±0.01 mm.

4. A printed board assembly according to claim 1, wherein the total length of said printed board assembly is within the MicroTCA standard of 180.6 mm ±0.1 mm.

5. A printed board assembly according to claim 1, wherein said logical port numbers are set according to the fixed pin allocation of the MicroTCA standard.

6. A printed board assembly according to claim 1, wherein the setting of logical port numbers is performed by a user of a software computer program.

7. A printed board assembly according to claim 1, wherein said printed circuit board layers comprises dielectric layers which all have a thickness of equal to or close to 100 µm.

8. A printed board assembly according to claim 1, wherein said printed circuit board layers comprises one grounded plane layer between the top most conductor layers and three grounded plane layers between the third and fourth top most conductor layers.

9. A method for enabling a printed board assembly for use in a MicroTCA system that complies with a MicroTCA Base Specification, wherein backplane pin connectors of said printed board assembly are arranged to be received in receiving connectors of a backplane interconnect, the printed board assembly comprising at least one switch unit which is arranged with physical output/input ports that have physical port numbers overridden by logical port numbers, an optimal routing of a number of sets of conductive threads in said printed board assembly arranged so that none of said conductive threads cross over each other while connecting physical output/input ports of said switch unit with said backplane pin connectors, and printed circuit board layers arranged to shield signals traveling in said conductive threads in conductive layers of said printed circuit board layers from any significant crosstalk, wherein the printed circuit board assembly complies with the MicroTCA Base Specification, the method comprising:
    assigning logical port numbers to physical output/input ports of at least one switch unit which overrides the physical output/input ports physical port numbers.

10. A method according to claim 9, wherein the step of assigning logical port numbers further comprises the step of:
    setting said logical port numbers in accordance with the fixed pin allocation of the MicroTCA standard.

11. A method according to claim 9, wherein the step of configuring printed circuit board layers of said printed board assembly further comprises the step of:
    configuring the printed circuit board layers of said printed board assembly in such a way that the total thickness of said printed circuit board layers is within the MicroTCA standard of 1.6 mm±0.16 mm.

12. A method according to claim 9, wherein the step of configuring printed circuit board layers further comprises the step of:
    configuring the printed circuit board layers of said printed board assembly in such a way that the thickness of all the dielectric layers are equal to or close to 100 µm.

13. A method according to claim 10, wherein the step of assigning logical port numbers further comprises the step of:
    setting said logical port numbers in a software computer program associated with the switch units.

* * * * *

UNITED STATES PATENT AND TRADEMARK OFFICE
CERTIFICATE OF CORRECTION

| | |
|---|---|
| PATENT NO. | : 7,800,915 B2 |
| APPLICATION NO. | : 11/812508 |
| DATED | : September 21, 2010 |
| INVENTOR(S) | : Engblom et al. |

It is certified that error appears in the above-identified patent and that said Letters Patent is hereby corrected as shown below:

In Column 6, Lines 23-34, delete "The optimal routing............are depicted".

In Column 9, Line 47, in Claim 1, delete "out-put/input" and insert -- output/input --, therefor.

In Column 10, Line 33, in Claim 9, delete "lavers" and insert -- layers --, therefor.

Signed and Sealed this
Third Day of July, 2012

David J. Kappos
*Director of the United States Patent and Trademark Office*